(12) United States Patent
Liebchen

(10) Patent No.: US 7,034,919 B2
(45) Date of Patent: Apr. 25, 2006

(54) METHOD AND APPARATUS FOR PROVIDING LENS ABERRATION COMPENSATION BY ILLUMINATION SOURCE OPTIMIZATION

(75) Inventor: Armin Liebchen, Hayward, CA (US)

(73) Assignee: ASML Masktools B.V., Veldhoven (NL)

( * ) Notice: Subject to any disclaimer, the term of this patent is extended or adjusted under 35 U.S.C. 154(b) by 0 days.

(21) Appl. No.: 10/705,234

(22) Filed: Nov. 12, 2003

(65) Prior Publication Data

US 2004/0184030 A1    Sep. 23, 2004

Related U.S. Application Data

(60) Provisional application No. 60/425,309, filed on Nov. 12, 2002.

(51) Int. Cl.
  *G03B 27/68*    (2006.01)
  *G03B 27/52*    (2006.01)

(52) U.S. Cl. .......................... 355/52; 355/55

(58) Field of Classification Search ................ 355/52, 355/53, 55, 67, 77; 250/201.2, 492.2; 359/432; 356/124
See application file for complete search history.

(56) References Cited

U.S. PATENT DOCUMENTS

| | | | |
|---|---|---|---|
| 5,300,786 A | 4/1994 | Brunner et al. | |
| 5,680,588 A | 10/1997 | Gortych et al. | |
| 5,805,290 A | 9/1998 | Ausschnitt et al. | |
| 5,822,066 A * | 10/1998 | Jeong et al. ............... | 356/521 |
| 5,965,309 A | 10/1999 | Ausschnitt et al. | |
| 5,969,441 A | 10/1999 | Loopstra et al. | |
| 6,033,814 A | 3/2000 | Burdorf et al. | |
| 6,046,792 A | 4/2000 | Van Der Werf et al. | |
| 6,128,067 A | 10/2000 | Hashimoto | |
| 6,563,566 B1 | 5/2003 | Rosenbluth et al. | |
| 2002/0036758 A1 * | 3/2002 | de Mol et al. ............... | 355/53 |
| 2002/0145720 A1 | 10/2002 | Smith | |
| 2002/0195538 A1 * | 12/2002 | Dowsk et al. ........... | 250/201.2 |

FOREIGN PATENT DOCUMENTS

| | | |
|---|---|---|
| EP | 1 239 331 A2 | 9/2002 |
| JP | 2000-232057 A | 8/2000 |
| WO | WO 98/40791 | 9/1998 |

OTHER PUBLICATIONS

Burn J. Lin, "the Exposure-Defocus Forest," Jpn. J. Appl. Phys. vol. 33 (1994) pp 6756-6764.

(Continued)

*Primary Examiner*—Peter B. Kim
(74) *Attorney, Agent, or Firm*—McDermott Will & Emery LLP

(57) ABSTRACT

A method for compensating for lens aberrations, which includes the steps of: (a) defining a cost metric which quantifies an imaging performance of an imaging system, where the cost metric reflects the effects of lens aberrations on the imaging performance; (b) defining a source illumination profile; (c) evaluating the cost metric based on the source illumination profile; (d) modifying the source illumination profile, and re-evaluating the cost metric based on the modified source illumination profile; and (e) repeating step (d) until the cost metric is minimized. The source illumination profile corresponding to the minimized cost metric represents the optimal illumination for the imaging device.

12 Claims, 5 Drawing Sheets

OTHER PUBLICATIONS

M. Dusa et al., "Study of mask serial images to predict CD prommimity and line end shortening of resist patterns," Proc. of SPIE vol. 4349 (2001), pp. 148-159.

B.P. Mathur et al., "Quantitative Evaluation of Shape of Image on Photoresist of Square Apertures," IEEE Transactions of Electron Devices, vol. 35, No. 3 (Mar. 1988), pp. 294-297.

Christopher J. Progler et al., "Merit functions for lithographic lens design," J. Vac. Sci. Technol. B 14(6), (Nov./Dec. 1996), pp. 3714-3718.

Nishrin Kachwala et al., "Imaging contrast improvement for 160 run line features using sub resolution assist features with binary, 6% temary attenuated phase shift mask with process turned resist," SPIE vol. 3679 (1999), pp. 55-67.

* cited by examiner

METHOD AND APPARATUS FOR PROVIDING LENS ABERRATION COMPENSATION BY ILLUMINATION SOURCE OPTIMIZATION

This application claims the benefit of 60/425,309, filed Nov. 12, 2002.

FIELD OF THE INVENTION

The present invention relates to photolithography, and in particular relates to a method for providing improved performance of lithographic processes by compensating for lens aberrations by performing an illumination source optimization process. In addition, the present invention relates to a device manufacturing method which incorporates the optimization process and utilizes a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

One factor that degrades the overall performance of the lithographic process is aberrations in the projection lens. Indeed, even though current manufacturing processes allow for production of lenses having high quality standards, lens aberrations still exist, which degrade the imaging performance. Furthermore, lenses age over time, and can exhibit an increase in aberrations and/or flare, thereby further degrading the performance of the lens. Accordingly, there is a need for a simple and cost effective method for compensating for lens aberrations and the degradation of lens performance over time.

As explained in detail below, the preferred embodiment of the present invention provides a method and apparatus for compensating for lens aberrations and the degradation of lens performance over time (e.g., lenses typically exhibit a drift the low order components of the aberration signature). However, prior to discussing the present invention, a brief overview of the lithographic process and some currently known optimization techniques are described so as to facilitate the understanding of the present invention. It is noted that as defined herein the term "lens aberration" includes effects due to distortion of lens, defocus, variations in laser wavelength, wafer flatness, and barometric pressure.

FIG. 1 is a block diagram illustrating the basic components of an imaging system 10. Referring to FIG. 1, the imaging system 10 includes an illumination source 12 for illuminating a mask 14 (also known as a reticle). Once passing through the mask, the light passes through a pupil 16 and is captured by the projection lens 18 and projected onto the substrate 20, on which the desired pattern is to be imaged. As can be appreciated from FIG. 1, if aberrations exist in the projection lens of the imaging system, degradations in performance occur.

It is noted that methods for optimizing the source illumination and mask patterns so as to improve the overall printing performance have been disclosed in the prior art. One such method is disclosed in U.S. Pat. Publication No. 2002/01490920 A1 to Rosenbluth et al. Specifically, Rosenbluth discloses a lithographic optimization system that alleges to perform an optimization of source illumination and mask patterns to improve the printing of a given mask pattern. The function of merit utilized by Rosenbluth for determining the optimal combination of the source/mask pattern is the aerial image log-slope at a number of pre-selected points along the border of the pattern geometry. The optimization algorithm appears based on the assumption that the printing of a lithographic pattern is solely determined by the set of diffraction orders collected in the imaging pupil, independent of their location in the pupil plane.

However, while maximizing the aerial image log-slope at selected sampling locations in the pattern enhances the budget/tolerance for exposure variations, commonly referred to as the exposure latitude (EL), it does not help to increase the budget/tolerance for focus variations, commonly referred to as the depth of focus (DOF). Indeed, it is known that patterns that are optimized for EL under in-focus conditions (i.e., at zero DOF) show complementary results compared to patterns that have been optimized for typical process conditions that accommodate for defocus variations. Thus, the optimization routine of Rosenbluth would suffer from this problem.

A further limitation of the optimization process of Rosenbluth is that the effect of a diffraction pattern on the projected image is assumed to be independent of the position of the diffraction orders in the pupil plane. Thus, the Rosenbluth process excludes the modeling of lens aberration effects which act as a pupil plane position dependent wave front modulation affecting the projected image as a function of the exact location of the diffraction pattern in the pupil plane.

Furthermore, it is known that illuminating mask patterns by utilizing off axis illumination (OAI) can enhance the depth of focus for printed images. An example of such applications are selectable diffractive optical elements (DOE) modules, such as Quasar, Dipole or Quadrupole Source illumination elements. Use of such elements can improve the DOF as well as the EL for a given lithographic process. However, such illuminators have predetermined shapes that may or may not produce the optimal possible illumination profile. Currently, there is no method for optimizing such source shape patterns to account for lens aberrations in the projection lens, while also improving both the DOF and the EL for a given lithographic process.

Accordingly, as noted above, there remains a need for a simple and cost effective method for compensating for lens aberrations and the degradation of lens performance over time, which also simultaneously optimizes the DOF performance for a given lithographic process.

SUMMARY OF THE INVENTION

In an effort to solve the foregoing deficiencies in the prior art, it is one object of the present invention to provide a method for compensating for lens aberrations and the degradation of lens performance over time. It is another objective of the present invention to perform the foregoing lens compensation while simultaneously optimizing the DOF performance. It is noted that as defined herein the term "lens aberration" includes effects due to distortion of lens, defocus, variations in laser wavelength, wafer flatness, and barometric pressure.

More specifically, the present invention relates to a method for compensating for lens aberrations, which includes the steps of: (a) defining a cost metric which quantifies an imaging performance of an imaging system, where the cost metric reflects the effects of lens aberrations on the imaging performance; (b) defining a source illumination profile; (c) evaluating the cost metric based on the source illumination profile; (d) modifying the source illumination profile, and re-evaluating the cost metric based on the modified source illumination profile; and (e) repeating step (d) until the cost metric is minimized. The source illumination profile corresponding to the minimized cost metric represents the optimal illumination for the imaging device.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. Most importantly, the present invention provides a lithographic source pattern optimization tool that automatically determines an illumination shape that compensates for lens aberrations and allows users to image with higher pattern fidelity. As a result, the present invention results in improved imaging performance and extends the useful life of the projection lens. As the projection lens is typically one of the most expensive parts of the imaging system, it is a significant benefit to extend the life of the projection lens (i.e., by improving the performance of the lens and compensating for degradations in lens performance over time, the present invention minimizes the frequency with which the lens need to be replaced). In addition, the method of the present invention also allows for the simultaneous optimization of additional metrics, such as, but not limited to, exposure latitude "EL".

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

Figure 1:
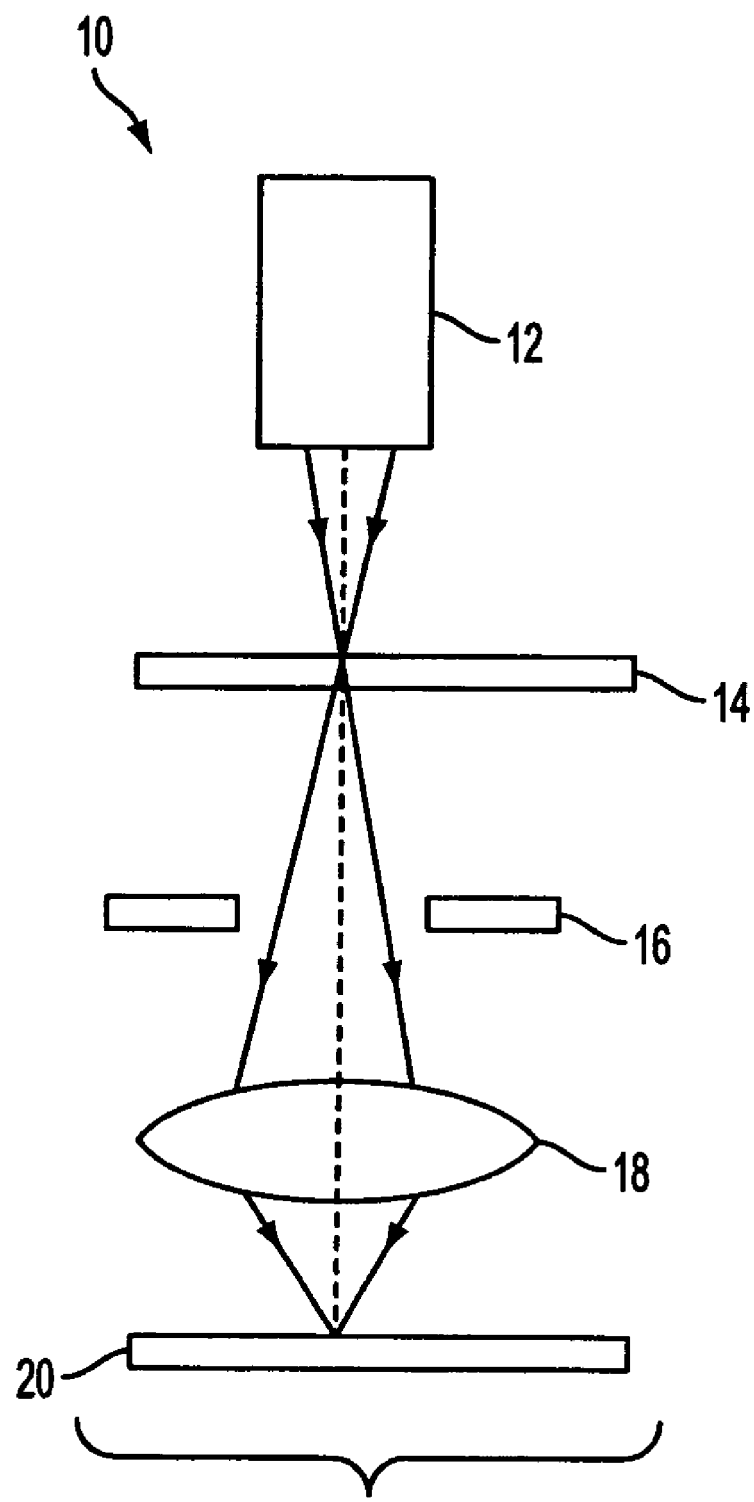
FIG. 1 is a block diagram illustrating the basic components of an imaging system.

As explained in further detail below, the object of the lithographic optimization process of the present invention is to first define and then minimize a cost metric "C" under a varying set of imaging conditions, where the cost metric C is a function of a set of process parameters which returns a numeric value that quantifies the performance of the imaging system. Importantly, the cost metric C must reflect the effects of lens aberration on imaging perform. In accordance with the present invention, the cost metric quantifies the effect of the shape of the illumination source on the resulting image printed on the substrate. The smaller the cost metric, the better the imaging process will perform (i.e., the more accurately the resulting image matches the target pattern).

As a practical matter, lithographic process optimization involves satisfying multiple constraints. Examples of such constraints include, but are not limited to, maximizing the image log slope, maximizing the depth of focus, minimizing line end shortening etc. Accordingly, given a set of such multiple performance criteria, a global cost function can be formulated as the weighted sum of each individual criterion as set forth in Equation 1.0.

$$C_{total} = \Sigma_i w_i C_i \quad \text{(Eq. 1.0)}$$

Thus, multiple objectives of the process optimization can be expressed as individual contributions $C_i$ to a global cost function. Further, the importance of each contribution can be weighted by an influence factor $w_i$.

As noted above, the object of the present invention is the minimization of negative effects of lens aberrations (including defocus) through illumination source optimization. To summarize, this is accomplished by first defining a cost metric $C_i$ that quantifies the effect of the source shape dependent image degradation on the printed wafer image given a specific aberration field in the pupil plane (i.e., projection lens) of the imaging system. In one embodiment of the present invention, the cost metric $C_i$ is optimized by itself, resulting in an illumination source profile that purely maximizes the process performance in the presence of lens aberration. In another embodiment, the cost metric $C_i$ is optimized in combination with other metrics, resulting in an illumination source profile with combined tradeoffs including the optimization of the image degradation due to lens aberrations and defocus.

Turning to the preferred embodiment of the present invention, a method is disclosed for measuring the image degradation of exposed wafer images due to the presence of lens aberrations and defocus as a function of the source illumination profile. The degradation is expressed in terms of a cost metric/function $C(w_s)$. The cost function $C(w_s)$ is subsequently evaluated for various source field distributions $w_s$ in order to determine the source field distribution (i.e., source illumination profile) that results in a minimum value of $C(w_s)$. It is noted that standard optimization techniques, for example, but not limited to, conjugate gradient methods, simulated annealing or generic algorithms, can be utilized to perform the minimization of $C(w_s)$.

Figure 2:
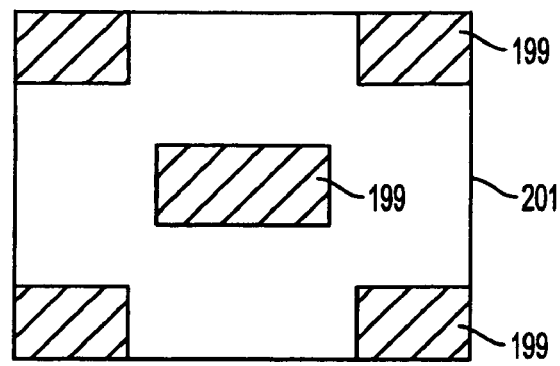
FIG. 2 illustrates an exemplary unit cell having features to be imaged on a substrate.

The first step in the optimization process is to define the cost function $C(w_s)$. Assuming the pattern to be imaged is a periodic pattern with a unit cell C, for such periodic patterns the diffraction orders in the pupil plane are mapped to a regular grid of discrete predetermined locations, known as diffraction orders. The exact position of these diffraction orders can be adjusted by an off-axis beam of the illumination source. FIG. 2 illustrates an exemplary unit cell 201 having features 199. In certain designs, such as those associated with SRAM and DRAM devices, such unit cells are continually repeated throughout the design.

The aerial image intensity I(r) measured in the object plane at point r is the result of an incoherent superposition from a multitude of source points $w_s$ each weighed by the transmission function $w_s$ (i.e., the various source illumination distributions).

The objective of the illumination source optimization is to find a source distribution $P_s$ that maximizes a specific performance metric (or equivalently minimizes a specific cost metric). More specifically, the objective is to minimize the imaging error induced by the existence of lens aberration in the transfer function of the optical projection system. Included in these aberrations is the consideration of defocus. Lens aberrations can be expressed as a phase distortion $\phi(k)$ applied to the transmission of diffraction orders through the imaging pupil.

Assuming $I_s(r)$ represents the contribution to the image intensity from a single source point s and $w_s$ is the transmission value of the illumination source at the respective point, the total image at I(r) can be expressed as:

$$I(r) = \sum_s w_s I_s(r) \qquad (\text{Eq. 2.0})$$

Assuming $E_s(r)$ represents the electric field associated with a point source s measured at point r in the object plane, $E_s(r)$ is a function of the discrete diffraction orders collected by the pupil aperture and according to standard imaging theory may be expressed as:

$$E_s(r) = \sum_n a_{sn} e^{ik_n r} \qquad (\text{Eq. 2.1})$$

where the subscript n refers to the finite set of all orders collected by the imaging pupil and $a_{sn}$ refers to a set of complex modulation coefficients (the diffraction amplitudes). In the following, the subscript s is omitted and implicitly assume the partial contribution from a coherent illumination emanating from source point s.

The effect of lens aberrations is to distort the diffraction amplitudes according to $$a'_n = a_n e^{i\phi(k_n)} \qquad (\text{Eq. 2.2})$$

where $a'_n$ represents the diffraction amplitude distorted by the aberration field $\emptyset(k)$. The electric field amplitude in the object plane subject to the aberration field $\emptyset(k)$ then follows as:

$$E'_s(r) = \sum_n a_n e^{ik_n r} e^{i\phi(k_n)} \qquad (\text{Eq. 2.3})$$

Subsequently the aberrated image intensity $I'_s(r)$ follows as:

$$I'_s(r) = \sum_{n,n'} a_n a^*_{n'} e^{i(k_n - k_{n'})r} e^{i(\phi(k_n) - \phi(k_{n'}))} \qquad (\text{Eq. 2.4})$$

It is observed that for all diagonal terms (n=n') in Eq. 2.4 the effect of aberrations cancels out. For off-diagonal terms (n≠n') we build the partial sums associated with pairs of (nn'+n'n), $a_n := |a_n| e^{i\theta_n}$:

$$I'_{s,nn'} = |a_n||a_{n'}|(e^{i(k_n - k_{n'})r + i(\theta_n - \theta'_n)} e^{i(\theta(k_n) - \phi(k_{n'}))} e^{-i(k_n - k_{n'})r - i(\theta_n - \theta'_n)} e^{-i(\theta(k_n) - \phi(k_{n'}))}) \qquad (\text{Eq. 2.5})$$

Define $\alpha := (k_n - k_{n'})r + (\theta_n - \theta'_n)$, $\Delta\phi := \phi(k_n) - \phi(k_{n'})$. After some simple algebraic transformations Eq. 2.5 may be expressed as:

$$I'_{s,nn'} = 2|a_n||a_{n'}|\cos(\alpha + \Delta\phi) \qquad (\text{Eq. 2.6})$$

$$= 2|a_n||a_{n'}|(\cos\alpha\cos\Delta\phi - \sin\alpha\sin\Delta\phi) \qquad (\text{Eq. 2.7})$$

In the following it is assumed that lens aberrations to be small ($\Delta\phi \ll 1$). Expansion of the sine and cosine terms up to first order yields:

$$I'_{s,nn'} \approx 2|a_n||a'_{n'}|(\cos\alpha - \Delta\phi\sin\alpha) \qquad (\text{Eq. 2.8})$$

The effect of the aberration field $\phi(k)$ on the partial image contribution $I'_{s,nn'}$ thus can be expressed as:

$$I'_{s,nn'}(r) \approx I_{s,nn'}(r) - 2|a_n||a_{n'}|\Delta\phi\sin\alpha(r) \qquad (\text{Eq. 2.9})$$

In the following, it is desired to minimize the effect of aberrations on $I'_{s,nn'}(r)$ for arbitrary points r in the object plane. In this case the factor $\sin\alpha(r)$ assumes the full range of $[-1,+1]$. Under the above assumptions the distortion on the coherent contribution $I_s$ to the total image intensity introduced by the aberration field is the bounded by:

$$|I'_s - I_s| \leq C_s, \qquad (\text{Eq. 3.0})$$

with $$C_s := 2\sum_{n<n'} |a_{sn}||a_{sn'}||\phi(k_n) - \phi(k_{n'})| \qquad (\text{Eq. 3.1})$$

Referring to the above expression together with (Eq. 2.0) the optimal illumination shape for reducing the effects of lens aberrations due to the aberration field $\phi(k)$ is characterized by a source field distribution $w_s$ that minimizes the cost functional $C(w_s)$:

$$C(w_s) := \sum_s w_s C_s \qquad (\text{Eq. 3.2})$$

Thus, Eq. 3.2 represents the cost function that must be minimized in order to minimize the effects of lens aberrations.

Figure 3:
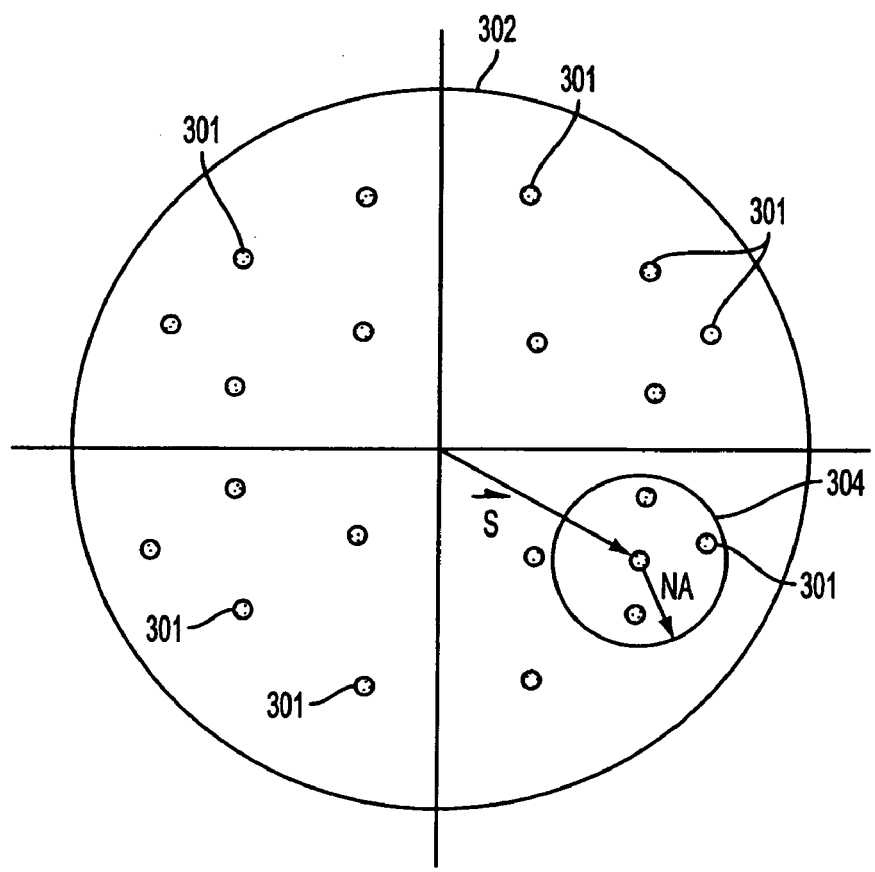
FIG. 3 illustrates an exemplary diffraction pattern resulting from imaging a periodic pattern.

Referring to FIG. 3, imaging a periodic pattern results in a set of discrete diffraction orders 301. Specifically, FIG. 3 illustrates an exemplary diffraction pattern resulting from imaging a periodic pattern. It is noted that the diffraction pattern illustrated in FIG. 3 does not correspond to the periodic pattern illustrated in FIG. 2. It is further noted that non-periodic patterns can be approximated as periodic patterns of a unit cell enclosing the pattern with a defined guard band for accuracy.

Figure 4:
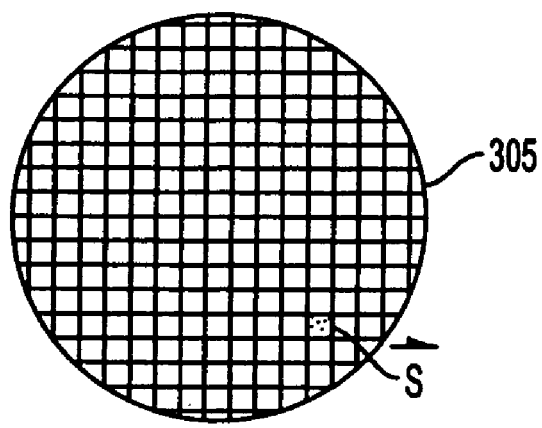
FIG. 4 illustrates an exemplary source illumination profile.

As is known, the diffraction orders 301 captured by the projection lens 304 of the imaging system determine the accuracy/performance of the replication of the desired pattern on the substrate. The amplitude "$a_n$" of the diffraction orders 301 are determined by the geometric shape of the features being imaged. Referring again to FIG. 3, the projection lens 304 collects a specific set of diffraction orders within the capture range of the numeric aperture of the lens 304. The position of the diffraction orders 301 relative to the lens 304 is determined by the illumination profile of the partial coherent illumination of the source element "s" in the illuminator. FIG. 4 illustrates an exemplary illuminator profile 305, in which a single illumination point "s" is illuminated. Accordingly, the displacement of a source element "s" in illuminator 305 causes a displacement vector "s" between the center of the collection pupil 304 (i.e., projection lens) and the center of the diffraction pattern 302. Thus, by manipulating the source elements "s" in the illuminator 305, is to possible to alter the diffraction orders captured by the pupil 304, and well as alter the location of the captured diffraction orders within the pupil 304. It is this manipulation of the source illuminator 305 that allows for the minimization of the degradation of imaging due to lens aberration. Specifically, if lens aberrations exist at certain locations within the pupil 304, the source illuminator 305 can be adjusted such that the diffraction orders do not fall within "aberration locations" on the pupil 304.

It is noted that in the absence of any lens aberrations, the exact position of the diffraction orders with the collection pupil 304 (i.e., projection lens) is irrelevant as long as the same diffraction orders are collected. However, as noted above, in the presence of lens aberrations or defocus, performance varies depending on the exact location of the diffraction orders within the lens pupil.

Figure 6:
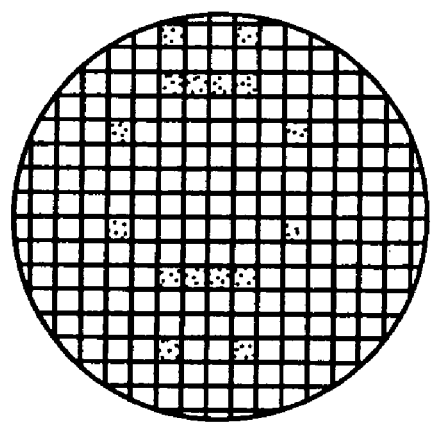
FIG. 6 illustrates another exemplary source illumination profile.
Figure 5:
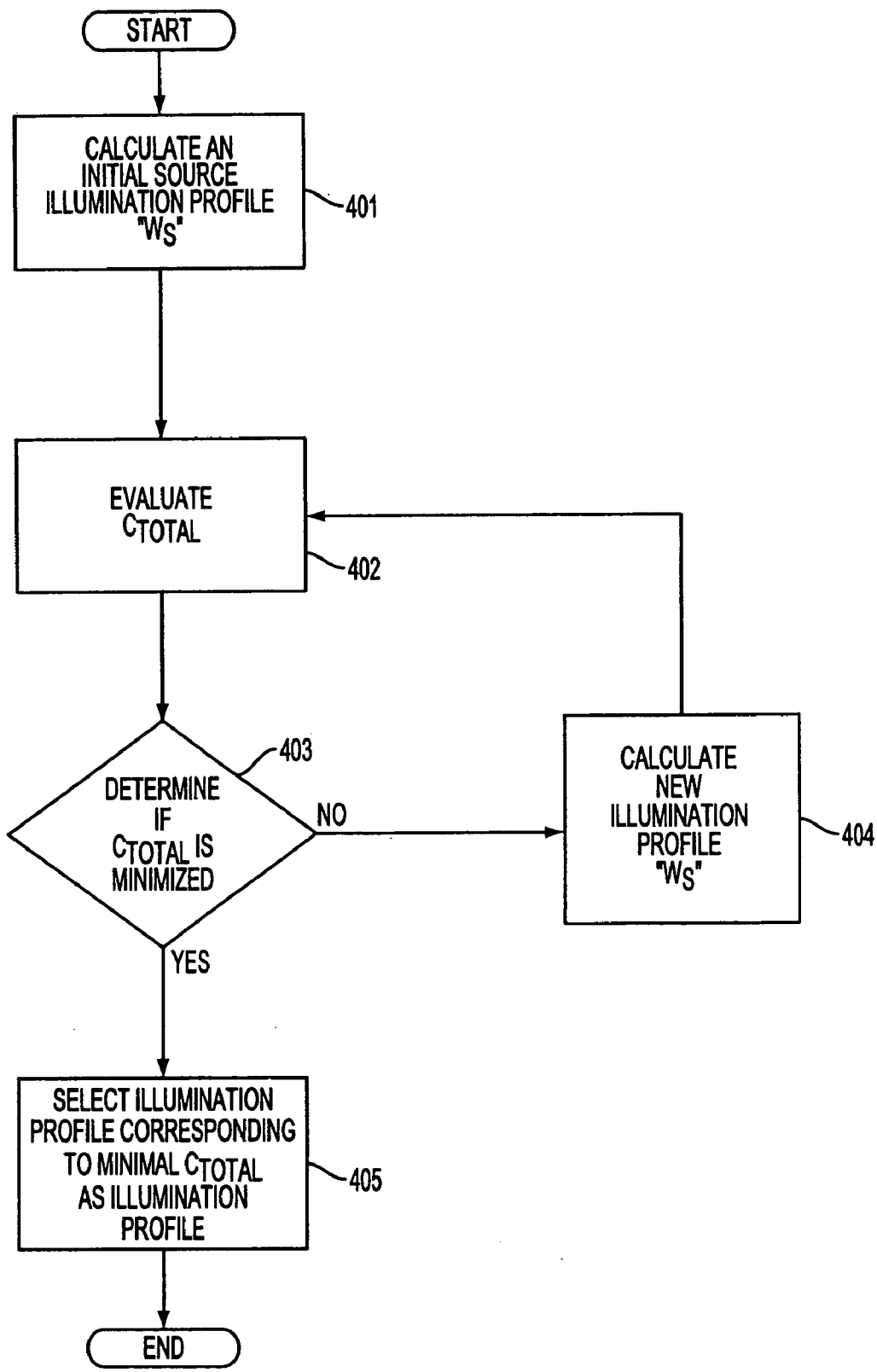
FIG. 5 is an exemplary flowchart illustrating the source illumination optimization process of the present invention

FIG. 5 is an exemplary flowchart illustrating the source illumination optimization process of the present invention. In the first step, Step 401, an initial source illumination profile "$w_s$" is calculated. The profile is represented as a set of transmission values "$w_s$" on a regular grid covering the illumination aperture. Referring to FIG. 6, the profile indicates which of the plurality of discrete points "$w_s$" forming the illumination grid are illuminated. For example, if operating in a "standalone" optimization mode as discussed above, the initial profile (i.e. shape) of the illuminator can be obtained by using a conventional illumination aperture at the maximum allowed setting of $\sigma_{out}$. Alternatively, if the optimization is applied in conjunction with the other cost metrics, the initial profile (i.e., shape) of the illuminator can be obtained by optimizing the shape taking into consideration the other cost metrics, but without consideration of lens aberrations.

In the next step, Step 402, the cost metric $C_{total}$ is evaluated. Initially, in the first pass through the reiterative process of the present invention, $C_{total}$ is assumed to be either identical to $C(w_s)$ (in the standalone optimization embodiment), or to include the effects of $C(w_s)$ according to Eq. 1.0 (in the combined optimization embodiment).

Then, in Step 403, the result of Step 402 is weighted and combined with all other metrics under consideration. This result is then compared against previous iterations, and if the result is determined to be a minimum, then the illumination profile "$w_s$" corresponding to the cost function $C(w_s)$, which has been determined to be a minimum, is selected to be the optimal source illumination profile (Step 405).

It is noted that the process of the present invention performs numerous iterations to determine whether or not the cost metric $C(w_s)$ is minimal. Referring again to FIG. 5, upon computing the cost metric $C(w_s)$ for the first time in Step 403, the value of $C(w_s)$ is stored in memory and the process proceeds to Step 404, where a new illumination profile "$w_s$" is selected. The process then loops back to Step 402 to calculate the $C(w_s)$ with the new illumination profile. The resulting cost metric $C(w_s)$ of this second iteration is then compared to the cost metric of the first iteration, and the source illumination profile corresponding to the minimal cost function is identified as the optimal illumination profile. This reiterative process is continued until it is confirmed that the minimal cost metric $C(w_s)$ has been obtained. In one embodiment a generic algorithm is applied to predict a profile most likely to reduce the cost metric based on the result of previous iterations.

In a variation to the foregoing, it is also possible to predefine a specified value epsilon, which is then compared against the largest change of $C(w_s)$ during a predetermined number of previous iterations (e.g., four iterations), and if the change in $C(w_s)$ is smaller than epsilon, process proceeds to Step 405 and the current illumination profile is selected as the optimal illumination profile.

Once the optimal illumination profile $w_s$ is identified, the operator has the option of manufacturing an illumination shaper, such as a diffractive optical element, which implements the optimal source illumination profile.

It is noted that the foregoing method of the present invention is typically implemented in a CAD (computer-aided design) program, such as discussed above, which would function in-part to perform the foregoing method and generate files representing the optimal illumination profile. Such a file, which could be an output of the CAD program, could be utilized to fabricate the diffractive optical element necessary for implementing the optimal source illumination.

The present invention also provides significant advantages over the prior art. Most importantly, the present invention provides a lithographic source pattern optimization tool that automatically determines an illumination shape that compensates for lens aberrations and allows users to image with higher pattern fidelity. As a result, the present invention results in improved imaging performance and extends the useful life of the projection lens. As the projection lens is typically one of the most expensive parts of the imaging system, it is a significant benefit to extend the life of the projection lens (i.e., by improving the performance of the lens and compensating for degradations in lens performance over time, the present invention minimizes the frequency with which the lens need to be replaced).

Figure 7:
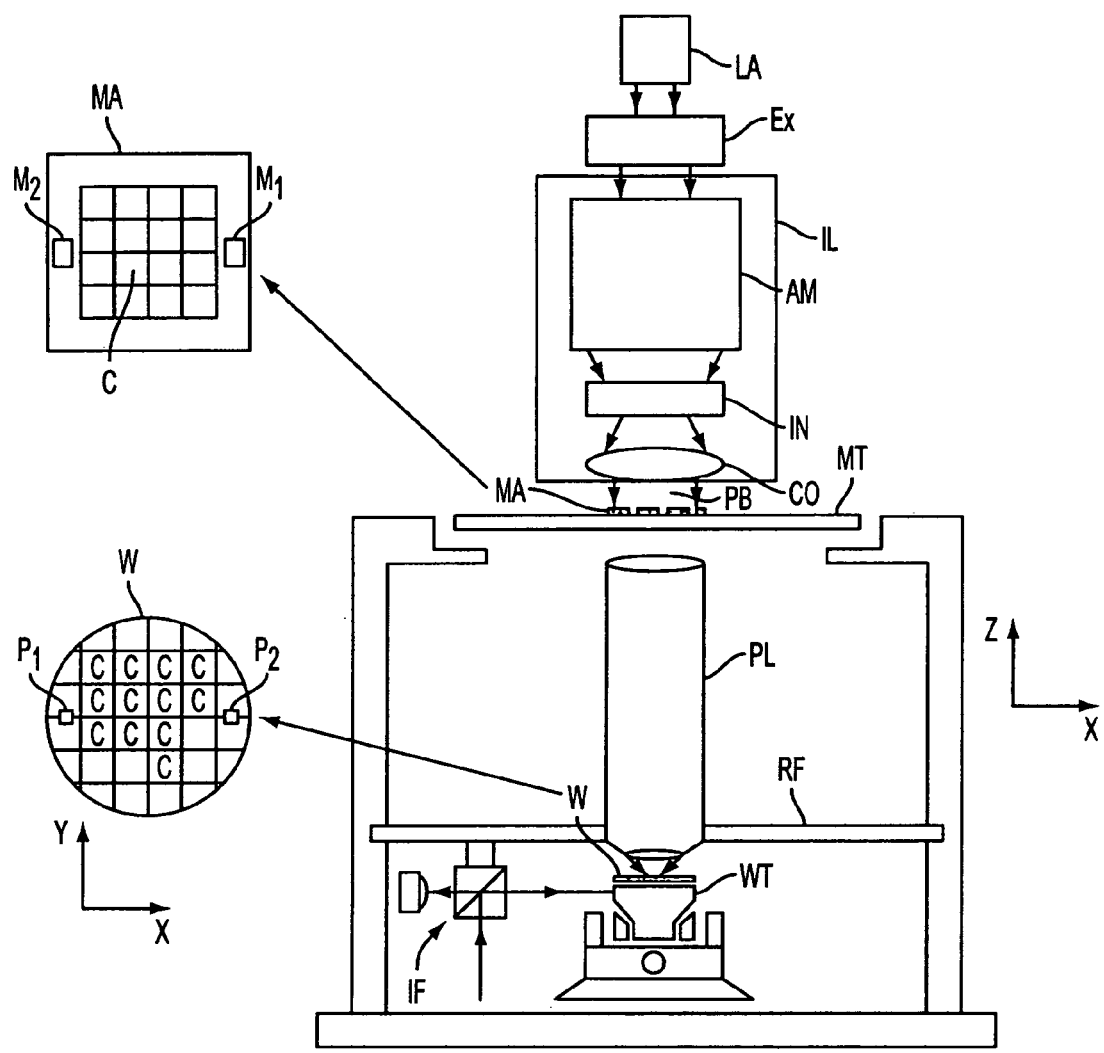
FIG. 7 schematically depicts a lithographic projection apparatus suitable for use with the masks designed with the aid of the current invention.

FIG. 7 schematically depicts a lithographic projection apparatus suitable for use with the masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 7 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method for compensating for lens aberrations, said method comprising the steps of:
   (a) defining a cost metric which quantifies an imaging performance of an imaging system, said cost metric reflecting the effects of lens aberrations on said imaging performance;
   (b) defining a source illumination profile;
   (c) evaluating said cost metric based on said source illumination profile;
   (d) modifying said source illumination profile, and re-evaluating said cost metric based on said modified source illumination profile; and
   (e) repeating step (d) until said cost metric is minimized.

2. The method for compensating for lens aberrations according to claim 1, wherein the result of evaluating said cost metric is a single numerical value representing the imaging performance of said imaging system.

3. The method for compensating for lens aberrations according to claim 1, further comprising the step of forming a diffractive optical element, said diffractive optical element implementing said source illumination profile corresponding to the minimized cost metric.

4. The method for compensating for lens aberrations according to claim 1, wherein said cost metric further reflects exposure latitude performance of the imaging process.

5. The method for compensating for lens aberrations according to claim 1, wherein said cost metric includes depth of focus performance of the imaging process.

6. A method for compensating for lens aberrations in an imaging system having an illumination source for illuminating a reticle and a projection lens for projecting light diffracted by said reticle onto a substrate, said method comprising the steps of:
   (a) defining a cost metric which quantifies an imaging performance of said imaging system, said cost metric reflecting the effects of lens aberrations of said projection lens on said imaging performance;
   (b) defining a source illumination profile defining the light illuminated on said reticle;
   (c) evaluating said cost metric based on said source illumination profile;
   (d) modifying said source illumination profile, and re-evaluating said cost metric based on said modified source illumination profile;
   (e) repeating step (d) until said cost metric is minimized;
   (f) selecting said source illumination profile corresponding to said minimized cost metric as the profile for illuminating said reticle.

7. The method for compensating for lens aberrations in an imaging system, according to claim 6, wherein the result of evaluating said cost metric is a single numerical value representing the imaging performance of said imaging system.

8. The method for compensating for lens aberrations in an imaging system according to claim 6, wherein said cost metric further reflects exposure latitude performance of the imaging process.

9. The method for compensating for lens aberrations in an imaging system according to claim 6, wherein said cost metric includes depth of focus performance of the imaging process.

10. A method for designing a diffractive optical element for use in an imaging system, said method comprising the steps of:
    (a) defining a cost metric which quantifies an imaging performance of an imaging system, said cost metric reflecting the effects of lens aberrations on said imaging performance;
    (b) defining a source illumination profile;
    (c) evaluating said cost metric based on said source illumination profile;
    (d) modifying said source illumination profile, and re-evaluating said cost metric based on said modified source illumination profile;

(e) repeating step (d) until said cost metric is minimized; and (f) generating said diffractive optical element which implements said source illumination profile corresponding to said minimized cost metric.

11. The method for designing a diffractive optical element according to claim 10, wherein the result of evaluating said cost metric is a single numerical value representing the imaging performance of said imaging system.

12. A computer program product for controlling a computer comprising a recording medium readable by the computer, means recorded on the recording medium for directing the computer to generate files corresponding to a diffractive optical element for use in an imaging system, said generation of the files comprising the steps of:

(a) defining a cost metric which quantifies an imaging performance of an imaging system, said cost metric reflecting the effects of lens aberrations on said imaging performance;

(b) defining a source illumination profile;

(c) evaluating said cost metric based on said source illumination profile;

(d) modifying said source illumination profile, and re-evaluating said cost metric based on said modified source illumination profile;

(e) repeating step (d) until said cost metric is minimized; and (f) defining said diffractive optical element which implements said source illumination profile corresponding to said minimized cost metric.

* * * * *

UNITED STATES PATENT AND TRADEMARK OFFICE
CERTIFICATE OF CORRECTION

PATENT NO. : 7,034,919 B2
APPLICATION NO. : 10/705234
DATED : April 25, 2006
INVENTOR(S) : Armin Liebchen It is certified that error appears in the above-identified patent and that said Letters Patent is hereby corrected as shown below:

Title page, page 2, column 2, under "OTHER PUBLICATIONS", In the article by "Nishrin Kachwala et al.", line 2, change "160 run line" to -- 160 nm line --.

Signed and Sealed this

Seventh Day of November, 2006

JON W. DUDAS
*Director of the United States Patent and Trademark Office*